United States Patent
Sasaki et al.

(10) Patent No.: US 7,615,498 B2
(45) Date of Patent: Nov. 10, 2009

(54) METHOD OF MANUFACTURING A SEMICONDUCTOR DEVICE

(75) Inventors: Yoichi Sasaki, Kanagawa (JP); Koichi Ohto, Kanagawa (JP); Noboru Morita, Kanagawa (JP); Tatsuya Usami, Kanagawa (JP); Hidenobu Miyamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/655,261

(22) Filed: Jan. 19, 2007

(65) Prior Publication Data

US 2007/0117405 A1   May 24, 2007

Related U.S. Application Data

(62) Division of application No. 11/048,929, filed on Feb. 3, 2005, now Pat. No. 7,180,191.

(30) Foreign Application Priority Data

Feb. 3, 2004   (JP) ............... 2004-027270

(51) Int. Cl.
   *H01L 21/31* (2006.01)
   *H01L 21/469* (2006.01)
(52) U.S. Cl. ............... 438/758; 257/E21.273
(58) Field of Classification Search ........... 438/758; 257/E21.273
   See application file for complete search history.

(56) References Cited

U.S. PATENT DOCUMENTS

| | | | |
|---|---|---|---|
| 6,054,379 A * | 4/2000 | Yau et al. | 438/623 |
| 6,340,435 B1 | 1/2002 | Bjorkman et al. | |
| 6,383,912 B1 * | 5/2002 | Chung et al. | 438/624 |
| 6,407,011 B1 | 6/2002 | Ikeda et al. | |
| 6,472,306 B1 | 10/2002 | Lee et al. | |
| 6,570,256 B2 * | 5/2003 | Conti et al. | 257/761 |
| 6,756,674 B1 | 6/2004 | Catabay et al. | |
| 2001/0004479 A1 * | 6/2001 | Cheung et al. | 427/553 |
| 2001/0010970 A1 * | 8/2001 | Uglow et al. | 438/622 |
| 2002/0074309 A1 * | 6/2002 | Bjorkman et al. | 216/13 |
| 2003/0042605 A1 * | 3/2003 | Andideh et al. | 257/741 |
| 2003/0155657 A1 * | 8/2003 | Tonegawa et al. | 257/774 |
| 2004/0048490 A1 * | 3/2004 | Tsuji et al. | 438/778 |
| 2004/0089924 A1 * | 5/2004 | Yuasa et al. | 257/673 |
| 2004/0155340 A1 | 8/2004 | Owada et al. | |
| 2004/0201108 A1 | 10/2004 | Kanamura | |
| 2006/0003572 A1 * | 1/2006 | Chen et al. | 438/622 |
| 2007/0093078 A1 * | 4/2007 | Harada et al. | 438/790 |

FOREIGN PATENT DOCUMENTS

JP   2002-203899   7/2002

* cited by examiner

*Primary Examiner*—Kiesha L Rose
*Assistant Examiner*—Igwe U Anya
(74) *Attorney, Agent, or Firm*—Young & Thompson

(57) ABSTRACT

A semiconductor device 200 comprises a SiCN film 202 formed on a semiconductor substrate (not shown), a first SiOC film 204 formed thereon, a SiCN film 208 formed thereon, a second SiOC film 210 formed thereon, a $SiO_2$ film 212 and a SiCN film 214 formed thereon. The first SiOC film 204 has a barrier metal layer 216 and via 218 formed therein, and the second SiOC film 210 has a barrier metal layer 220 and wiring metal layer 222 formed therein. Carbon content of the second SiOC film 210 is adjusted larger than that of the first SiOC film 204. This makes it possible to improve adhesiveness of the insulating interlayer with other insulating layers, while keeping a low dielectric constant of the insulating interlayer.

6 Claims, 7 Drawing Sheets

METHOD OF MANUFACTURING A SEMICONDUCTOR DEVICE

This application is based on Japanese patent application No. 2004-027270 the content of which is incorporated hereinto by reference.

BACKGROUND OF THE INVENTION

1. Field of the Invention

The present invention relates to a semiconductor device including an insulating interlayer composed of a low-dielectric-constant insulating material, and method of manufacturing the same.

2. Description of the Related Art

With recent demands on faster operation speed of semiconductor devices, a great deal of investigational efforts have been made on alteration of an insulating interlayer from conventional silicon oxide film (dielectric constant K=4.3 or around) to a low-dielectric-constant insulating material layer, in order to reduce the inter-wiring capacitance. The low-dielectric-constant insulating material referred to herein is any insulating material having a dielectric constant of 3.6 or below. Examples of the low-dielectric-constant insulating material include HSQ, carbon-containing silicon oxide material and aromatic-group-containing organic resin material those having a dielectric constant of 3 or around. In pursuit of further reduction in the dielectric constant, recent developmental efforts are also made on a porous material having micro-pores introduced into the film. Use of this sort of low-dielectric-constant insulating material to the insulating interlayer makes it possible to reduce inter-wiring crosstalk, and to realize fast operations of elements.

Use of the low-dielectric-constant insulating material as the insulating interlayer, however, raised a problem of showing a poor adhesiveness to an etching stopper film or a protective film such as SiCN film or the like, and of causing peeling-off.

Japanese Laid-Open Patent Publication No. 2002-203899 discloses a technique of plasma treatment improving the adhesiveness of the insulating layer for the case where copper is used as a wiring material.

The conventional method is, however, raised a problem in that the plasma treatment must be respectively given to copper and barrier metal layer in order to ensure a desirable adhesiveness, and this makes the process complicated.

The above-described degradation in the adhesiveness between the insulating interlayer and the etching stopper film or the like is likely to occur particularly for the case where the insulating interlayer contains carbon in the lower layers of the multi-layered wiring film. FIG. 6 is a chart showing results of adhesiveness between an SiOC film, formed as an insulating interlayer by the CVD process, and a SiCN film, evaluated under varied C (carbon) content of the SiOC film. The evaluation of the adhesiveness herein was made by the m-ELT (modified edge liftoff test) process. As is known from the chart, the adhesiveness decreases as the carbon content of the SiOC film increases.

It is therefore supposed that lowering in the carbon content of the insulating interlayer may improve the adhesiveness between the insulating interlayer and the etching stopper film or the like. The lowering in the carbon content of the insulating interlayer, however, raises a new problem of increase in dielectric constant of the film.

SUMMARY OF THE INVENTION

The present inventors found that this sort of peeling-off is more likely to occur in via-formed layer than in wiring-formed layer. B analyzing the problem, the inventors found that a metal component contained in the wiring-formed layer and via-formed layer functions as a wedge capable of improving the adhesiveness between the low-dielectric-constant insulating material and etching stopper film or the like. It is consequently supposed that, in the via-formed layer, abundance ratio of the metal at the interface between the insulating interlayer and etching stopper film or the like is smaller than that in the wiring-formed layer, and this is causative of the degraded adhesiveness with the etching stopper film or the like.

According to the present invention, there is provided a semiconductor device which comprises: a semiconductor substrate; an insulating interlayer provided on the semiconductor substrate and contains at least carbon; a first insulating layer and a second insulating layer provided, on the semiconductor substrate, so as to contact with one surface and other surface, respectively, of the insulating interlayer so as to hold it from the upper and lower sides thereof; and a via and a wiring provided in the insulating interlayer, so as to be connected to the first insulating layer and the second insulating layer, respectively, and so as to be connected to each other in the insulating interlayer; wherein in the insulating interlayer, carbon content of the layer having the wiring formed therein is larger than carbon content of the layer having no wiring formed therein.

It is to be noted herein that the layer having both of the via and wiring formed therein is referred to as a layer having the wiring formed therein. The via contacts with the first insulating layer, and the wiring contacts with the second insulating layer. The wiring and via can be composed typically of Cu (copper), Ag (silver), or alloy of these metals. It is also allowable to compose them using these materials alloyed with at least any one of foreign metals selected from W (tungsten), Mg (magnesium), Be (beryllium), Zn (zinc), Pd (palladium), Cd (cadmium), Au (gold), Hg (mercury), Pt (platinum), Zr (zirconium), Ti (titanium), Sn (tin), Ni (nickel), Nd (neodymium), Si and Fe (iron).

The carbon content of the insulating interlayer refers to a ratio of carbon to the component (except metal) of the film, such as Si, O, C and H. The same will apply also to the description below. The insulating interlayer herein is composed of a wiring-formed layer having the wiring formed therein, and a via-formed layer having the via formed therein (having no wiring formed therein). The insulating interlayer can be composed of a material essentially containing Si, O, and C. Use of this sort of material raises a problem of adhesiveness with other insulating layers. The insulating layers are typically an etching stopper film, diffusion blocking film and protective film.

As described in the above, the insulating interlayer containing carbon is more degraded in the adhesiveness with other insulating layers as the carbon content of the film increases. To achieve a desirable adhesiveness with other insulating layers, it is preferable to lower the carbon content of the insulating interlayer. On the other hand, decrease in the carbon content of the insulating interlayer undesirably raises the dielectric constant thereof, and increase inter-wiring crosstalk. The present invention, however, makes it possible to improve the adhesiveness between the insulating interlayer and other insulating layers, by raising the carbon content in the layer having the wiring formed therein, having a larger abundance ratio of the metal content at the interface between the insulating interlayer and insulating layer, to thereby keep the dielectric constant low, and by lowering the carbon content in the layer having only the via formed therein, having a smaller abundance of the metal material at the interface. This sort of structure is applicable to multi-layered wiring, and in particular to the lower wiring-formed layer having a dense structure. For example in a nine-layered wiring structure, this is applicable to the first to sixth layers or around, because these layers are likely to be affected by the degraded adhesiveness. This is successful in improving the adhesiveness of the layer likely to cause degradation in the adhesiveness, and to simplify the formation process of other layers.

In the present invention, the insulating interlayer can be configured so that the layers listed below are stacked in this order:

(i) the wiring-formed layer provided in the same layer with the wiring; and (ii) the via-formed layer provided in the same layer with the via connected to the upper or lower portions of the wiring.

It is also allowable to provide a CMP protective film in the upper portion of (i). The CMP protective film can preferably be composed of a material such as SiCN, $SiO_2$, SiC and SiN. The CMP protective film may be composed of a multi layer including any combination of layers selected from a SiCN film, a $SiO_2$ film, a SiC film and a SiN film.

It is also allowable to provide a diffusion blocking film in the lower portion of (ii). The diffusion blocking film can preferably be composed of a carbon-containing material such as SiCN and SiC.

In thus-configured insulating interlayer, a relation of $$c_1 > c_2$$

can be set, where the carbon content of the (i) wiring-formed layer is given as c1, and the carbon content of the (ii) via-formed layer is given as $c_2$. This is successful in keeping a low dielectric constant of the insulating interlayer, by raising the carbon content of the wiring-formed layer having a large abundance ratio of the metal material, and also successful in improving the adhesiveness of the insulating interlayer with other insulating layers such as CMP protective film and diffusion blocking film, by lowering the carbon content of the via-formed layer having a small abundance ratio of the metal material.

In the semiconductor device of the present invention, it is also allowable that a layer having carbon content lower than that in the other regions may be formed in the layer of the insulating interlayer having no wiring formed therein, at the interface with the first insulating layer.

Formation of this sort of film makes it possible to further improve the adhesiveness between the insulating interlayer and first insulating layer.

In the semiconductor device of the present invention, it is also allowable that a layer having carbon content lower than that in the other regions may be formed in the layer of the insulating interlayer having the wiring formed therein, at the interface with the second insulating layer.

Formation of this sort of film makes it possible to further improve the adhesiveness between the insulating interlayer and second insulating layer. It is to be noted that, the insulating interlayer in the present invention can be provided with this sort of film having a low carbon content, even in the layer thereof having the wiring formed therein, wherein it is configured so that an average value of the carbon contents of the layer having the wiring formed therein is set larger than an average value of the carbon contents of the layer having no wiring formed therein. This is successful in keeping the dielectric constant of the layer having the wiring formed therein.

According to the present invention, there is provided also a semiconductor device which comprises: a semiconductor substrate; and a multi-layered wiring structure formed on the semiconductor substrate, comprising a plurality of wiring structures stacked therein, each of the wiring structures comprising an insulating interlayer provided on the semiconductor substrate and contains at least carbon; a first insulating layer and a second insulating layer provided, on the semiconductor substrate, so as to contact with one surface and other surface, respectively, of the insulating interlayer so as to hold it from the upper and lower sides thereof; and a via and a wiring provided in the insulating interlayer, so as to be connected to the first insulating layer and the second insulating layer, respectively, and so as to be connected to each other in the insulating interlayer; wherein in the multi-layered wiring structure, an average value of carbon contents of the layers, having the wirings formed therein, in the plurality of insulating interlayers is larger than an average value of carbon contents of the layers having no wiring formed therein.

The via herein is in contact with the first insulating layer, and the wiring is in contact with the second insulating layer. For the layer having both of the via and wiring formed therein, the average value is calculated assuming it as a layer having the wiring formed therein. According to the present invention, it is made possible to keep a low dielectric constant of the insulating interlayer, by raising the carbon content of the wiring-formed layer having a large abundance ratio of the metal material, and also to improve the adhesiveness of the insulating interlayer with the insulating layer, by lowering the carbon content of the layer having only the via formed therein and having a small abundance ratio of the metal material.

In the semiconductor device of the present invention, the first insulating layer or the second insulating layer can be composed of a SiCN film, a $SiO_2$ film, a SiC film, a SiN film, or a multi layer including any combination of layers selected from a SiCN film, a $SiO_2$ film, a SiC film, or a SiN film.

Although this sort of insulating layers have been suffered from a problem of a poor adhesiveness with the carbon-containing insulating interlayer, the present invention is successful in ensuring a desirable adhesiveness between the insulating layer and the insulating interlayer. The adhesiveness with the carbon-containing insulating interlayer may be most likely to degrade when the first insulating layer or the second insulating layer is composed of a carbon-containing SiCN film, but the present invention makes it possible to keep the adhesiveness at a desirable level.

According to the present invention, there is provided still also a semiconductor device which comprises: a semiconductor substrate; and an insulating layer provided on the semiconductor substrate, an insulating interlayer in contact with the insulating layer and contains at least carbon, and a metal component formed in the insulating interlayer and in contact with the insulating layer; wherein the insulating interlayer is formed so as to vary the carbon content thereof at the interface with the insulating layer, depending on abundance ratio of the metal component at the interface with the insulating layer.

It is to be noted herein that the abundance ratio of the metal component refers to area ratio of the metal component at the interface between the insulating interlayer and the insulating layer. The metal component may be the wiring or via. The wiring and via may be configured as having a barrier metal layer formed therearound, wherein the abundance ratio of the metal component in this case is defined as that of the metal component inclusive of the barrier metal layer.

Because the carbon content is controlled depending on the abundance ratio of the metal component at the interface, the present invention makes it possible to keep the dielectric constant of the insulating interlayer as low as possible, and to improve the adhesiveness with the insulating layer.

According to the present invention, there is provided still also a semiconductor device which comprises: a semiconductor substrate; and a multi-layered wiring structure formed on the semiconductor substrate, comprising a plurality of wiring structures stacked therein, each of the wiring structures comprising an insulating layer provided on the semiconductor substrate, an insulating interlayer containing at least carbon and provided on or under the insulating layer so as to contact therewith, and a metal component formed in the insulating interlayer so as to contact with the insulating layer; wherein, for the case where abundance ratios of the metal components at the interfaces with the insulating layers in contact with the insulating interlayers are not larger than an average value of abundance ratios of the metal components in the plurality of insulating interlayers, the plurality of insulating interlayers are respectively configured so as to adjust the carbon contents thereof at the interfaces smaller than a reference value.

The average value of the abundance ratios of the metal components can be defined as an average value of the abundance ratios of the metal components at the interfaces between the insulating interlayers and insulating layers. The average value of the abundance ratios of the metal components can be determined also by calculating volume of the metal components in the insulating interlayers. It is to be noted herein that "a plurality of insulating interlayers" can be understood as a plurality of insulating interlayers formed as being vertically aligned, and is in particular applicable to a first layer and a second layer formed right above an element-forming layer of a transistor and so forth.

By lowering the carbon contents of the insulating interlayers at the interfaces having the abundance ratios of the metal components lower than the average value, the present invention makes it possible to keep a desirable adhesiveness of the insulating interlayers with other insulating layers. The reference value of the carbon content herein can be specified so as to adjust the dielectric constant of the insulating interlayer to 3.3 or below, and more preferably 2.9 or below. The reference value herein can be adjusted to 11%, and more preferably to 14%. For an exemplary case where the insulating interlayer is a SiOC film formed by the CVD process, the reference value can be adjusted to 14% in order to adjust the dielectric constant of the insulating interlayer to 2.9 or below. At the interfaces having the abundance ratios of the metal components larger than the average value, it is also allowable to configure the insulating interlayers so as to have the carbon contents larger than the reference value. This makes it possible to keep a low dielectric constant of the insulating interlayers at the interfaces having large abundance ratios of the metal components.

It is also allowable to form the films having the carbon contents lower than the reference value, also at the interfaces having abundance ratios of the metal components larger than the average value. Even in this case, the insulating interlayers are configured so that the average value of the carbon contents thereof becomes larger than the reference value, in the films having the abundance ratios of the metal components larger than the average value. This is successful in keeping low dielectric constants of the insulating interlayers.

For example, it is allowable to substantially equalize the carbon contents in the principal portions both in the films having the abundance ratios of the metal components larger and smaller than the average value. In this case, films having the carbon contents smaller than those in the principal portions can be formed between the films having the abundance ratios of the metal components smaller than the average value and other insulating layers. This makes it possible to ensure a desirable adhesiveness between the films having the smaller abundance ratios of the metal components with other insulating layers, without need of an additional process step of forming such films for the layers having the larger abundance ratios of the metal components.

In the present invention, the insulating layer may be composed of a SiCN film, a $SiO_2$ film, a SiC film, a SiN film, or a multi layer including any combination of layers selected from a SiCN film, a $SiO_2$ film, a SiC film, or a SiN film. Although this sort of insulating layers have been suffered from a problem of a poor adhesiveness with the carbon-containing insulating interlayer, the present invention is successful in ensuring a desirable adhesiveness between the insulating layer and the insulating interlayer. The adhesiveness with the carbon-containing insulating interlayer may be most likely to degrade when the insulating layers are composed of carbon-containing SiCN films, but the present invention makes it possible to keep the adhesiveness at a desirable level.

In the semiconductor device of the present invention, the insulating interlayer can be a SiOC film formed by the CVD process.

Although this sort of insulating interlayers have been suffered from a problem of a poor adhesiveness with the insulating layers, the present invention is successful in ensuring a desirable adhesiveness between the insulating layers and the insulating interlayers.

According to the present invention, there is provided still also a method of manufacturing a semiconductor device, which comprises: forming an insulating layer on a semiconductor substrate; forming an insulating interlayer, containing at least carbon, in contact with the insulating layer; and forming a metal component in the insulating interlayer so as to contact with the insulating layer; wherein in the step of forming the insulating interlayer, the insulating interlayer is formed while varying flow rate of a carbon-containing gas, considering abundance ratio of the metal component at the interface between the insulating interlayer and the insulating layer.

In the step of forming the insulating interlayer, first, the abundance ratio of the metal component at the interface between the insulating interlayer and the insulating layer in contact therewith after the fabrication is calculated based on a design drawing of the semiconductor device of the present invention. Based on thus-calculated abundance ratio, a desirable carbon content of the film is then calculated. A flow rate of the carbon-containing gas is then determined so as to adjust the carbon content of the insulating interlayer to the calculated value. This procedure makes it possible to fabricate the semiconductor device containing the insulating interlayer having a desired value of carbon content.

The present invention therefore makes it possible to improve the adhesiveness of the insulating interlayer with other insulating layers, while keeping a low dielectric constant of the insulating interlayer.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the embodiments of the-present invention, the insulating interlayer having the wiring and via formed therein contain a low-dielectric-constant insulating material composed of SiOC. It is to be noted that SiOC herein may include materials sometimes expressed as SiOCH, and generally contains Si, O, C and H as constituent elements.

First Embodiment

Figure 1A:
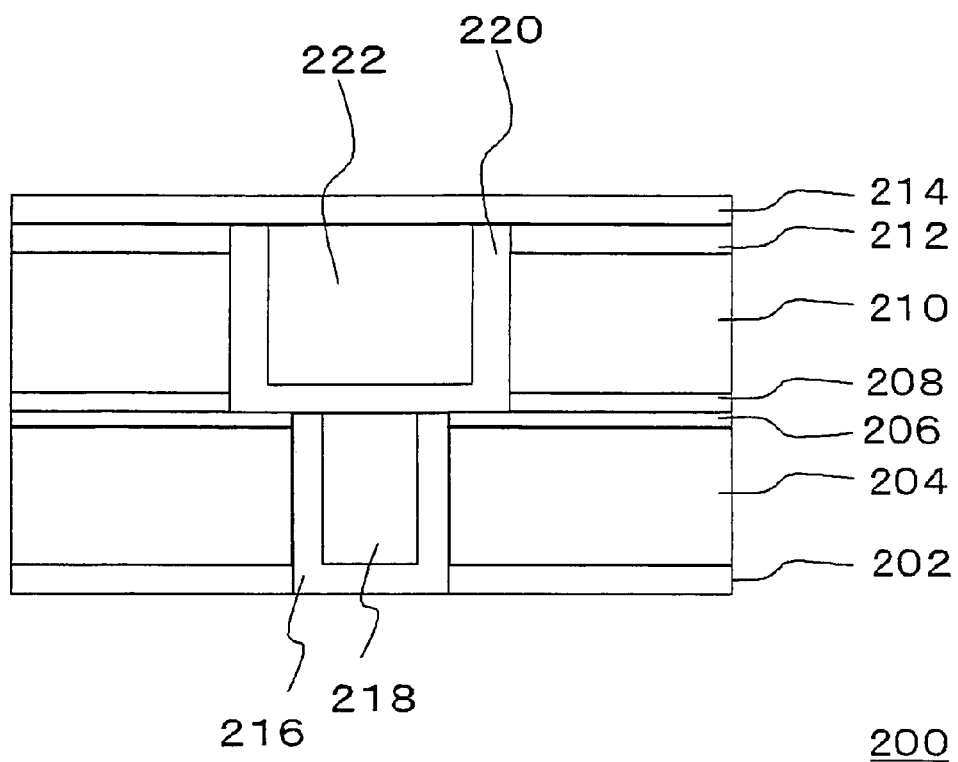
FIGS. 1A and 1B are schematic sectional views showing configurations of a semiconductor device according to an embodiment of the present invention.
Figure 1B:
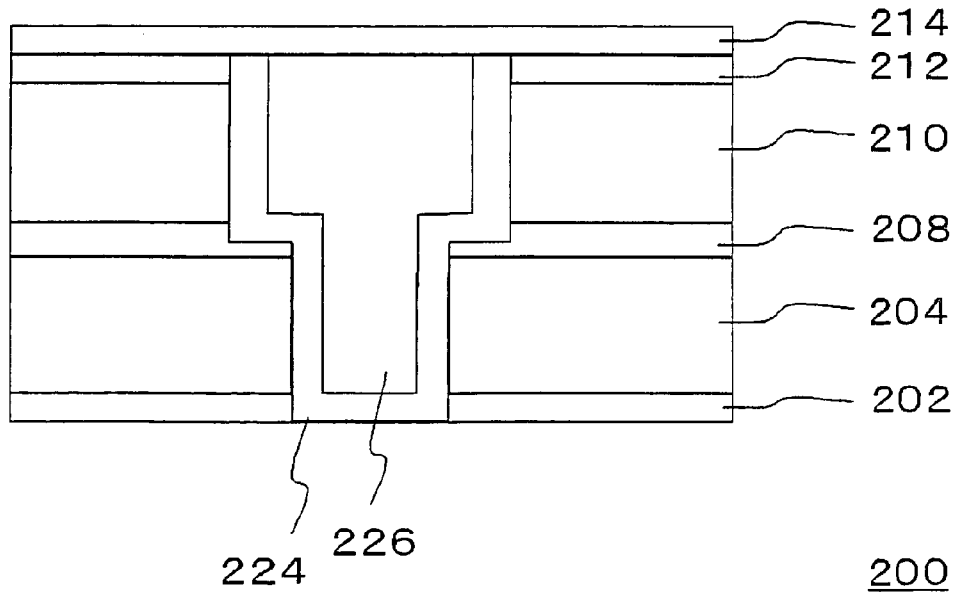

FIGS. 1A and 1B are schematic sectional views showing a configuration of a semiconductor device 200 of the present embodiment. FIG. 1A shows a wiring structure formed by the single damascene process.

The semiconductor device 200 includes a SiCN film 202 formed on a semiconductor substrate (not shown), a first SiOC film 204 formed thereon, a SiO$_2$ film 206 formed thereon, a SiCN film 208 formed thereon, a second SiOC film 210 formed thereon, a SiO$_2$ film 212 formed thereon, and a SiCN film 214 formed thereon. The first SiOC film 204 has a barrier metal layer 216 and via 218 formed therein, and the second SiOC film 210 has a barrier metal layer 220 and a wiring metal layer 222 formed therein.

Here, carbon (CH$_3$ group) contents of the first SiOC film 204 and second SiOC film 210 are determined depending on the abundance ratios of the metal components in these films. The abundance ratios of the metal components herein means area ratios of the barrier metal layer 216, via 218, wiring metal layer 222 and barrier metal layer 220 at the interfaces between these films and the SiCN film 202, SiO$_2$ film 206, SiCN film 208 and SiO$_2$ film 212. The carbon contents of the first SiOC film 204 and second SiOC film 210 are ratio of C to Si, O, C and H in the films. In this embodiment, the carbon contents of the insulating interlayers are determined considering the abundance ratios of the metal components, assuming the first SiOC film 204 having the via 218 formed therein and the second SiOC film 210 having the wiring metal layer 222 formed therein as a single unit of the insulating interlayers.

In this embodiment, the second SiOC film 210 having the wiring metal layer 222 formed therein is larger in the abundance ratio of the metal component than the first SiOC film 204 having the via 218 formed therein. The second SiOC film 210 is therefore formed so as to have a larger carbon content than that of the first SiOC film 204.

Lowering in the carbon content of the first SiOC film 204 makes it possible to ensure a desirable adhesiveness between the first SiOC film 204 and SiCN film 202. On the other hand, the second SiOC film 210 shows a desirable adhesiveness with the SiCN film 208 and SiO$_2$ film 212, because the wiring metal layer 222 formed therein raises the abundance ratio of the metal component and can function as a wedge. This makes it possible to raise the carbon content of the second SiOC film 210 to thereby keep a small dielectric constant, and to keep a desirable adhesiveness with the SiCN film 208 and SiO$_2$ film 212.

To keep the dielectric constant to a low level, the carbon contents of the films are preferably adjusted to 14% or above. This makes it possible to suppress the dielectric constant of the SiOC film typically to as low as 2.9 or below.

To ensure a desirable adhesiveness with the SiCN film and SiO$_2$ film, it is preferable to adjust (carbon content in the SiOC film)/(abundance ratio of the metal component in the SiOC film) to 14 or below.

The SiCN film 202, SiCN film 208 and SiCN film 214 function as an etching stopper film when any layers formed thereon are etched. The etching stopper film may also be composed of a SiO$_2$ film, SiN film or SiC film, in place of the SiCN film. It is still also allowable to use, in place of the first SiOC film 204 and second SiOC film 210, other carbon-containing films such as methyl silsesqui-oxane (MSQ) film, hydrogenated methyl silsesqui-oxane (MHSQ) film, organic polysiloxane film, or any of these films modified to have a porous structure. Also in this case, lowering of the carbon contents of the films is successful in ensuring a desirable adhesiveness with the etching stopper film typically composed of SiCN.

FIG. 1B shows a wiring structure formed by the dual-damascene process. The semiconductor device 200 includes the SiCN film 202, the first SiOC film 204, the SiCN film 208, the second SiOC film 210, the SiO$_2$ film 212, and the SiCN film 214. The first SiOC film 204 and second SiOC film 210 have a barrier metal layer 224 and a wiring metal layer 226 formed therein.

Figure 2A:
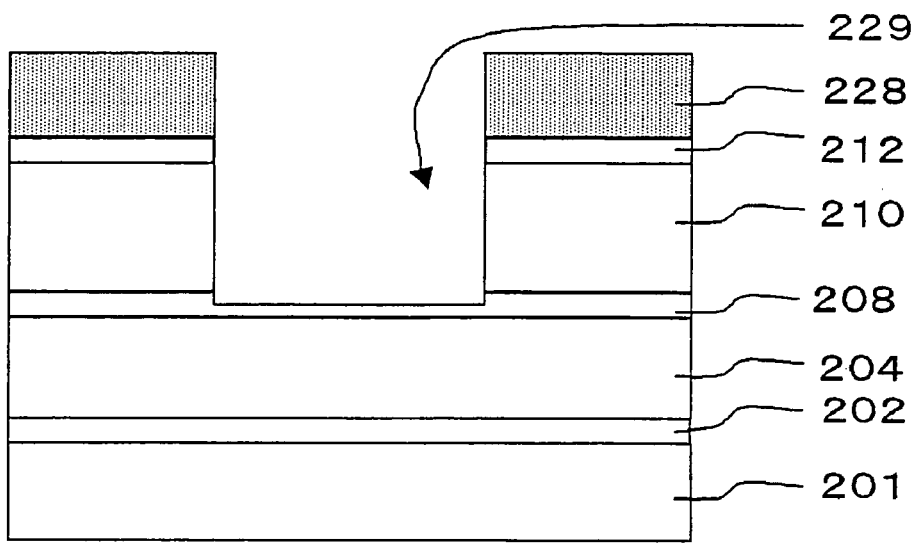
FIGS. 2A to 2C are schematic sectional views showing manufacturing processes of the semiconductor device shown in FIG. 1B, formed by the dual-damascene process.
Figure 2B:
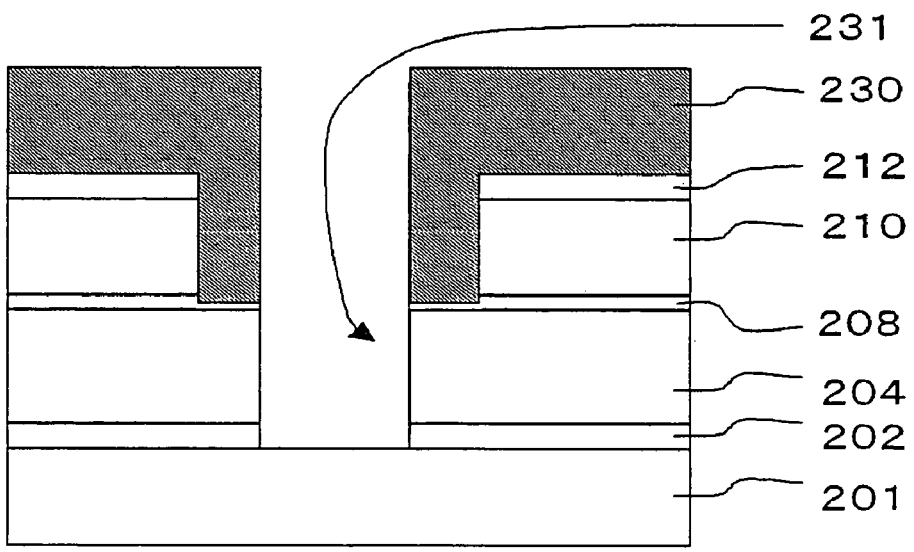
Figure 2C:
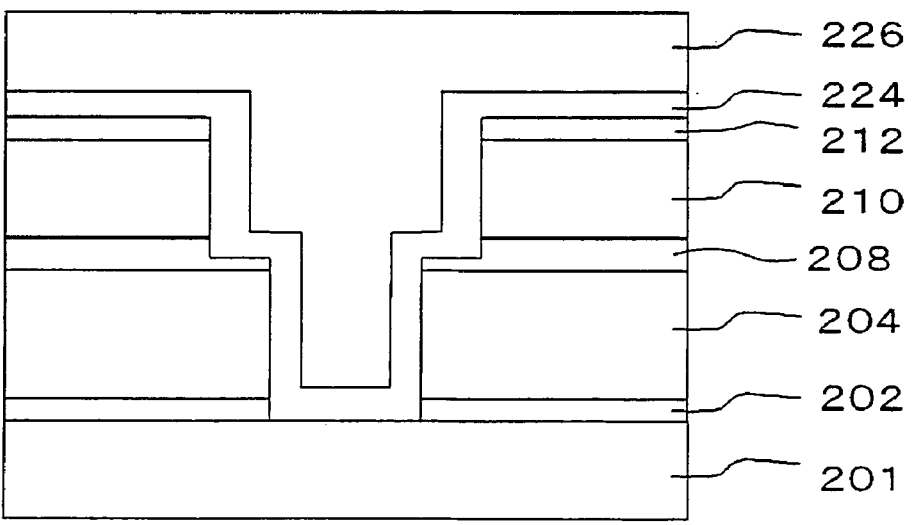

FIGS. 2A to 2C are schematic sectional views showing manufacturing procedures of the semiconductor device 200 shown in FIG. 1B.

First, an insulating underlayer 201 is provided on a substrate (not shown), and thereon the SiCN film 202 (50 nm thick, for example) is formed by the plasma CVD process. Next, on the SiCN film 202, the first SiOC film 204 (300 nm thick, for example) is formed by the plasma CVD process under supply of trimethylsilane gas. Film-forming conditions for the first SiOC film 204 may appropriately be set depending on some other circumferences, but typically include O$_2$: 500 sccm, He: 300 sccm and trimethylsilane: 100 to 1000 scam under temperature: 350° C., pressure: 4 Torr and RF power: 600 W.

Thereafter, on the first SiOC film 204, the SiCN film 208 (50 nm thick, for example) is formed by the plasma CVD process. Next, on the SiCN film 208, the second SiOC film 210 (300 nm thick, for example) is formed by the plasma CVD process under supply of trimethylsilane gas. Film-forming conditions for the second SiOC film 210 may appropriately be set depending on some other circumferences. In an exemplary case, the temperature, pressure, RF power, and oxygen and helium flow rates can be set equal to those in the formation of the first SiOC film 204, and the trimethylsilane gas flow rate can be set larger than that in the formation of the first SiOC film 204. This is successful in adjusting the carbon content of the second SiOC film 210 larger than that of the first SiOC film 204. Next, on the second SiOC film 210, the SiO$_2$ film 212 (approximately 100 nm thick, for example) is formed by the plasma CVD process.

Thereafter, a resist film 228 is formed on the SiO$_2$ film 212. Next, the resist film 228 is patterned into a desired geometry. Thereafter, by publicly-known techniques of lithography and etching effected through the resist film 228 as a mask, a wiring trench 229 is formed in the SiCN film 208, second SiOC film 210, and SiO$_2$ film 212 (FIG. 2A). It is also allowable to provide an antireflection film under the resist film 228 for better controllability in the resist patterning, although not shown herein.

Next, the resist film 228 used for the formation of the wiring trench 229 is removed. Another resist film 230 is formed on the SiO$_2$ film 212 so as to fill the wiring trench 229. The resist film 230 is then patterned into a predetermined geometry. Thereafter, by publicly-known techniques of lithography and etching effected through the resist film 230, a via plug 231 is formed in the SiCN film 202 and first SiOC film 204 (FIG. 2B).

Thereafter, the resist film 230 is removed. This results in formation of the via plug 231 and wiring trench 229 in a communicated manner. Next, the barrier metal layer 224 is formed in the via plug 231 and wiring trench 229 by the sputtering process. The barrier metal layer 224, barrier metal layer 216 and barrier metal layer 220 (see FIG. 1A) can be configured as having at least one of Ta/TaN, Ti, TiN, TiSiN, Ta, TaN, and TaSiN.

Next, on the barrier metal layer 224, the wiring metal layer 226 is formed so as to fill the via plug 231 and wiring trench 229, typically by the electroplating process (FIG. 2C). The wiring metal layer 226, via 218 and wiring metal layer 222 (see FIG. 1A) can be composed of Cu (copper), Ag (silver) or alloys of these metals, for example. It is also allowable to compose them using any of these materials alloyed with at least any one of foreign metals selected from W (tungsten), Mg (magnesium), Be (beryllium), Zn (zinc), Pd (palladium), Cd (cadmium), Au (gold), Hg (mercury), Pt (platinum), Zr (zirconium), Ti (titanium), Sn (tin), Ni (nickel), Nd (neodymium), Si and Fe (iron).

Thereafter, unnecessary portions of the wiring metal layer 226 and barrier metal layer 224 formed outside the wiring trench 229 are removed by CMP (chemical-mechanical polishing). The SiO$_2$ film 212 functions as a protective film in the CMP removal of the wiring metal layer 226 and barrier metal layer 224 formed outside the wiring trench 229. In some other examples, semiconductor device 200 can also be configured as excluding the SiO$_2$ film 212. Next, on the SiO$_2$ film 212, the SiCN film 214 is formed by the plasma CVD process. By these procedures, the semiconductor device 200 shown in FIG. 1B is manufactured.

Figure 7:
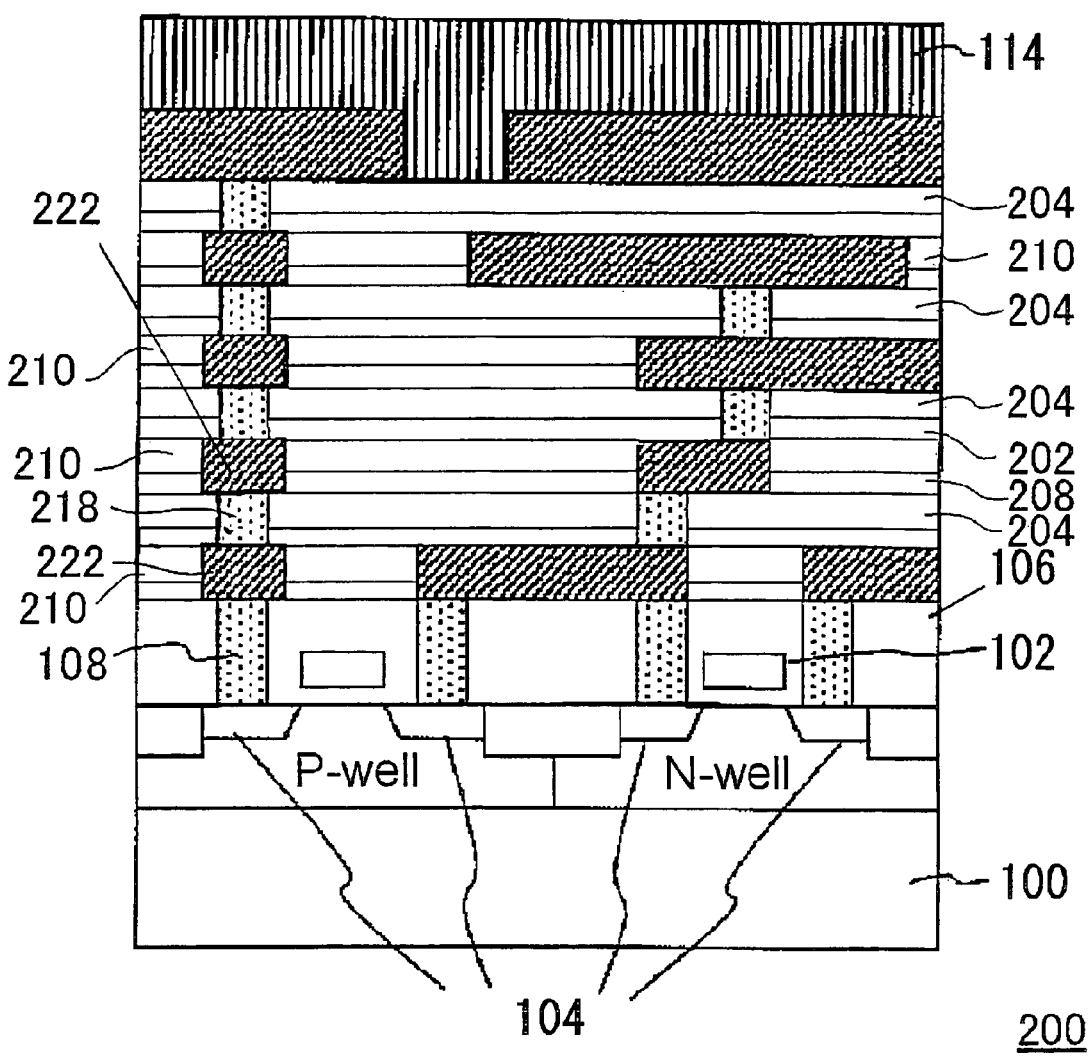
FIG. 7 is a schematic sectional view showing an exemplary multi-layered wiring structure.

A semiconductor device having a multi-layered structure can be obtained by repeating the above-described procedures. FIG. 7 is a schematic sectional view showing an exemplary multi-layered wiring structure. In this example, a MOS transistor which comprises a gate electrode 102, diffusion layers 104 and so forth is formed on a silicon substrate 100. An insulating layer 106 is formed so as to cover the MOS transistor. Further thereon, the aforementioned multi-layered wiring structure is formed. Contact layers 108 are formed between the diffusion layers 104 and the multi-layered wiring structure. On the topmost portion of the multi-layered wiring structure, a passivation film 114 is provided. In thus-formed multi-layered wiring structure, an average value of the carbon contents of the second SiOC films 210 having the wirings formed therein is larger than an average value of the carbon contents of the first SiOC films 204 having no wiring formed therein. It is to be noted that, for the insulating interlayers having both of the vias and wirings formed therein, the average value is calculated assuming the films as those having the wirings formed therein.

For the case, in the multi-layered wiring structure, where the abundance ratios of the metal components, such as the wirings and vias, at the interfaces with other insulating layers in contact with the insulating interlayers are not larger than an average value of abundance ratios of the metal components in the plurality of insulating interlayers contained in the multi-layered wiring structure, the plurality of insulating interlayers are respectively configured so as to adjust the carbon contents thereof at the interfaces smaller than a "reference value", and the insulating interlayers in each layer are respectively configured so as to have the carbon contents at the interface not larger than the "reference value". The "reference value" herein is a carbon content of an insulating interlayer which is adjusted to have the dielectric constant of 3.3 or below, and more preferably of 2.9 or below. In the present embodiment, the "reference value" is preferably 11%, for example, and more preferably 14%. For an exemplary case where SiOC films are used as the insulating interlayers, adjustment of the carbon contents to 14% makes it possible to adjust the dielectric constant to 2.9 or below. For the case where the abundance ratios of the metal components at the interfaces between the individual insulating interlayers and other insulating layers are larger than the average value, the insulating interlayers are configured so as to have an average value of the carbon contents larger than the "reference value".

The embodiment in the above explained so-called "trench-first" process in which the wiring trench is formed prior to the via plug, but it is also allowable to adopt so-called "via-first" process in which the via plug is formed in advance, or so-called "middle-first" process in which the wiring trench is formed after the etching stopper film for via plug formation is formed, and the via plug is then formed.

Figure 3:
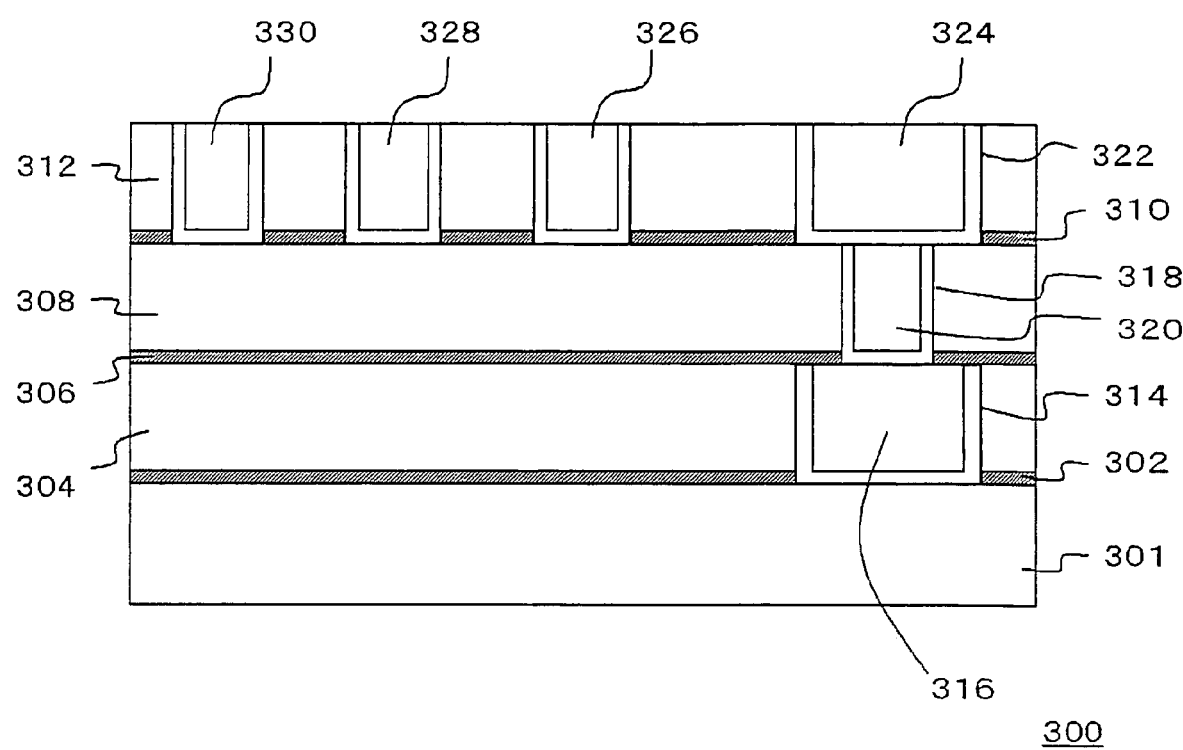
FIG. 3 is a schematic sectional view showing another example of the semiconductor device according to the embodiment.

FIG. 3 is a drawing showing another example of the semiconductor device according to this embodiment.

The semiconductor device 300 includes an insulating underlayer 301, a SiCN film 302, a SiOC film 304, a SiCN film 306, a SiOC film 308, a SiCN film 310 and a SiOC film 312. The SiOC film 304 has a barrier metal layer 314 and a wiring metal layer 316 formed therein. The SiOC film 308 has a barrier metal layer 318 and a via 320 formed therein. The SiOC film 312 has a wiring metal layer 324, a barrier metal layer 322, a wiring metal layer 326, a wiring metal layer 328 and a wiring metal layer 330 formed therein.

Abundances of the metal components in the SiOC film 304, SiOC film 308 and SiOC film 312 are set largest to smallest in the SiOC film 312, SiOC film 304 and SiOC film 308 in this order. The SiOC film 304, SiOC film 308 and SiOC film 312 contain Si, O, C and H, wherein the carbon contents of these films are set largest to smallest in the SiOC film 308, SiOC film 304 and SiOC film 312 in this order. The larger the abundance of the metal component in the film becomes, the stronger the wedge effect of the metal component becomes, and this results in improvement in the adhesiveness of the SiCN film in contact with the film. The SiOC film 312 is, therefore, successful in ensuring a desirable adhesiveness with the SiCN film 310 even if the carbon content thereof is large. On the other hand, the SiOC film 308 is low in the abundance of the metal component, so that it is configured as having a low carbon content. This is successful in ensuring a desirable adhesiveness of the SiOC film 308 with the SiCN film 310 and SiCN film 306.

Second Embodiment

Figure 4A:
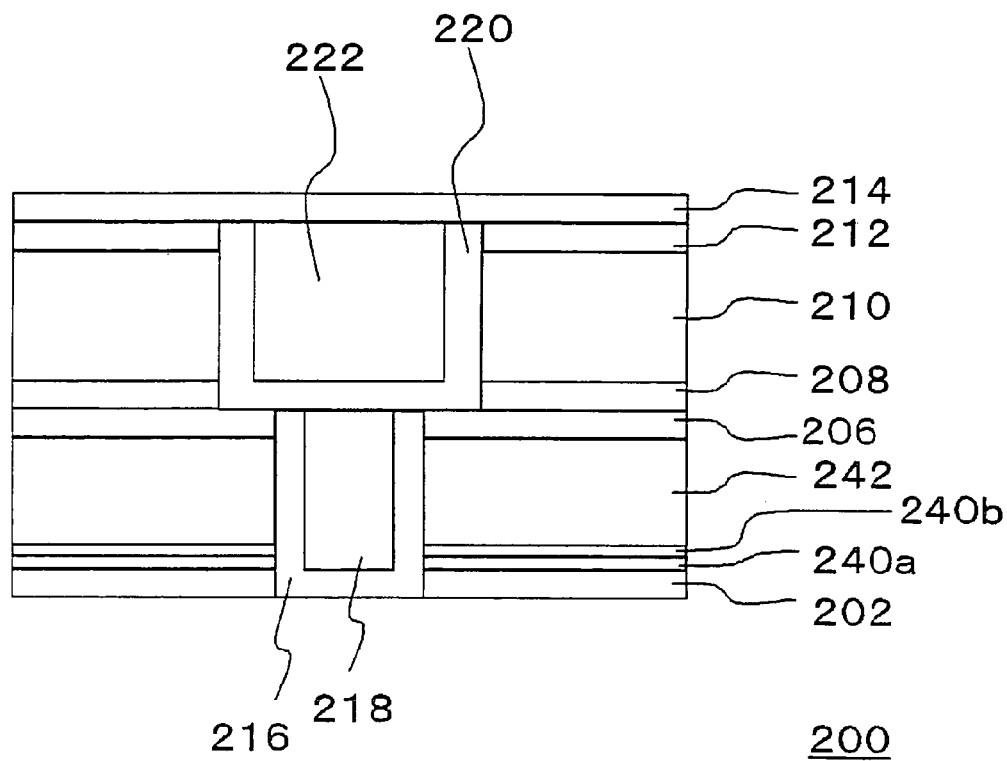
FIGS. 4A and 4B are schematic sectional views showing configurations of a semiconductor device of another embodiment of the present invention.
Figure 4B:
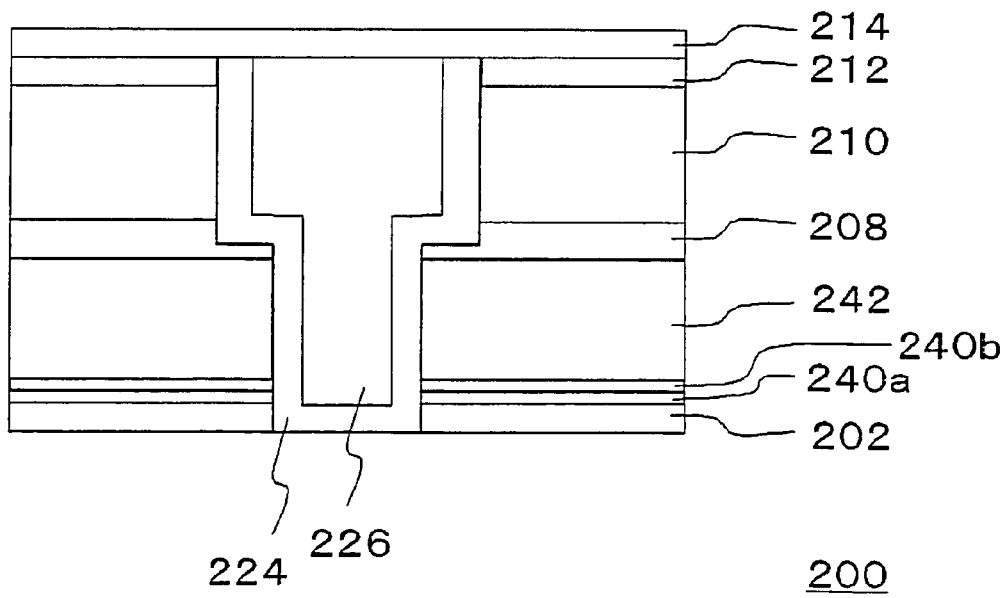

FIGS. 4A and 4B are schematic sectional views of the semiconductor device 200 in this embodiment.

FIG. 4A shows a wiring structure formed by the single-damascene process. The semiconductor device 200 herein further comprises a third SiOC film 240a and a fourth SiOC film 240b, in addition to the configuration shown in FIG. 1A described in the first embodiment. It also includes a fifth SiOC film 242 in place of the first SiOC film 204 in the configuration shown in FIG. 1A. In this embodiment, any constituents equivalent to those in the first embodiment will be given with the same reference numerals, omitting the description.

In the embodiment, the carbon contents of the fifth SiOC film 242 and second SiOC film 210 may substantially be equivalent. Abundance of the metal component in the fifth SiOC film 242 herein is smaller than that of the second SiOC film 210. In this embodiment, any film which is low in the abundance of metal components will have a film, having the carbon content lower than that of the other regions, formed in the region thereof in contact with the SiCN film 202. The carbon contents of the fourth SiOC film 240b and third SiOC film 240a are set smaller than those of the second SiOC film 210 and fifth SiOC film 242. The carbon content of the third SiOC film 240a is set smaller than that of the fourth SiOC film 240b. Lowering of the carbon content towards the interface with the SiCN film 202 in this way makes it possible to ensure a desirable adhesiveness with the SiCN film 202. It is to be noted that only two layers of the third SiOC film 240a and fourth SiOC film 240b are shown herein, but it is also allowable to provide a larger number of layers having the carbon contents appropriately varied therein, or to continuously vary the carbon content. The carbon contents in the film can be varied by gradually reducing flow rate of trimethylsilane gas during the film formation.

Although not shown in the drawing, a SiOC film having a small carbon content may be provided also between the fifth SiOC film 242 and SiCN film 208, similarly to the third SiOC film 240a and fourth SiOC film 240b. This makes it possible to ensure a desirable adhesiveness between the fifth SiOC film 242 and the film formed thereon.

FIG. 4B shows a wiring structure formed by the dual-damascene process. Also in this example, the carbon contents of the second SiOC film 210 and fifth SiOC film 242 are substantially equivalent, and the third SiOC film 240a and fourth SiOC film 240b are formed between the fifth SiOC film 242 and SiCN film 202. The carbon contents of the third SiOC film 240a and fourth SiOC film 240b are set smaller than that of the fifth SiOC film 242.

As described in the above, in this embodiment, the interstitial film having small carbon contents are provided between the insulating interlayer and other insulating layers formed in contact thereto, when the insulating interlayer composed of a low-dielectric-constant material has only a small abundance of the metal component, and this is successful in ensuring a desirable adhesiveness between the insulating interlayer and other insulating layers. The insulating interlayer having a large abundance of the metal component can keep the adhesiveness with other insulating layers at a desirable level, and this makes it possible to solve the peeling-off problem in the semiconductor device, without adding any process step of forming the interstitial film.

EXAMPLES

Figure 5:
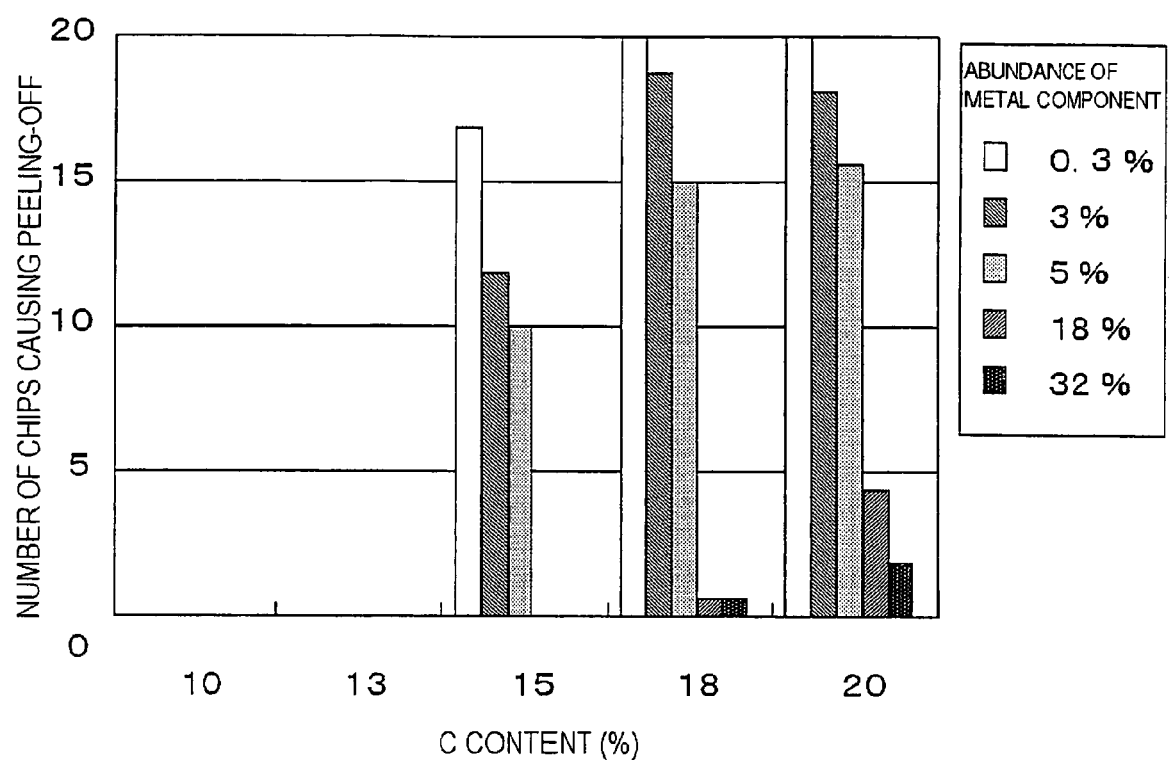
FIG. 5 is a graph showing occurrence of peeling-off of a SiOC film depending on the abundance ratio of metal component (%) and carbon content (%)
Figure 6:
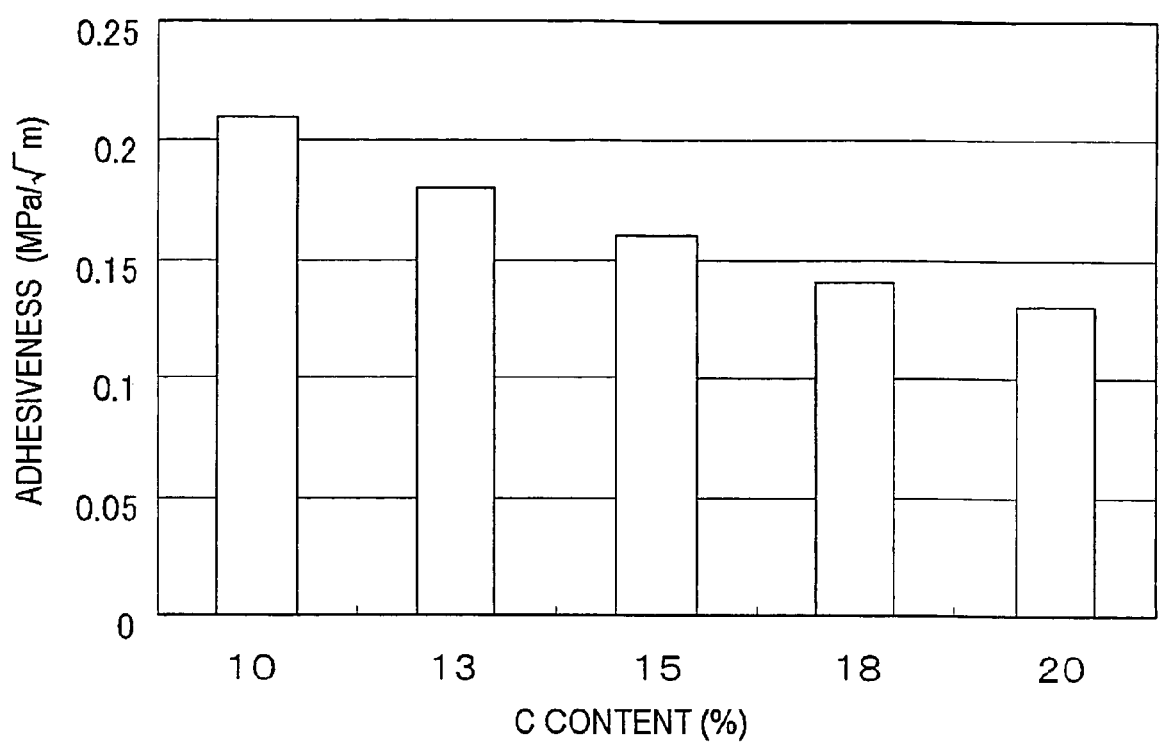
FIG. 6 is a chart showing results of adhesiveness between an SiOC film, formed as an insulating interlayer by the CVD process, and a SiCN film, evaluated under variation in C (carbon) content of the SiOC film.

FIG. 5 is a graph showing occurrence of peeling-off of a SiOC film depending on the abundance ratio of metal component (%) and carbon content (%).

Samples were fabricated as described below. First, an insulating underlayer is provided on a semiconductor substrate, and thereon a SiCN film (50 nm thick) was formed by the plasma CVD process. Thereafter, a SiOC film (300 nm thick) was formed on the SiCN film by the plasma CVD process. Film-forming conditions for the SiOC film typically include temperature: 350° C., pressure: 4 Torr, RF power: 600 W, $O_2$: 500 sccm and He: 300 sccm, wherein flow rate of trimethylsilane was varied as 800 sccm, 1200 sccm and 1500 sccm, so as to adjust the carbon contents of the film to 15%, 18% and 20%, respectively. Thereafter, a resist film is formed on the SiOC film, and a wiring trench was formed by lithographic and etching techniques. The resist film was then removed. Next, a Ta/TaN barrier metal layer was formed in the wiring trench by the sputtering process. Thereafter, a wiring metal layer was formed by the electroplating process, on the barrier metal layer so as to fill the wiring trench. Next, unnecessary portions of the metal film and barrier metal layer formed outside the wiring trench were removed by CMP, to thereby fabricate the semiconductor device. Thus-fabricated semiconductor device was cut into a plurality of chips having a predetermined size. The abundance ratio of the metal at the contact surface between the of the SiCN film and SiOC film in each chip was calculated base on the mask design. Twenty chips were individually inspected, and the number of chips causing the peeling-off was found.

It was found from the results shown in FIG. 5 that the SiOC film having a larger carbon content was more likely to cause the peeling-off, and a lower abundance ratio of the wiring metal layer at the contact surface between the SiOC film and SiCN film was more likely to cause the peeling-off. In an exemplary case where the abundance ratio of the wiring metal layer at the contact surface is 18% or more, almost no peeling-off was observed even under the carbon content of 15%. On the contrary, the peeling-off was observed for 10 or more chips individually having an abundance ratio of the wiring metal layer at the contact surface of 5% or below.

The present invention has been described in the above based on the embodiments and examples. The embodiments and examples herein are merely for the purpose of exemplification, and it will be readily understood by those skilled in the art that any modifications will be allowable and that such modifications will fall within the scope of the present invention.

For example, it is allowable also in the first embodiment to provide a SiOC film having a small carbon content between the insulating interlayer and other insulating layers, such as between the first SiOC film 204 and SiCN film 202, or between the second SiOC film 210 and SiCN film 208, similarly to as described in the second embodiment. This is successful in keeping the dielectric constant of the insulating interlayer at a low level, and in improving the adhesiveness between the films.

Although it is described in the embodiments of the present that the etching stopper film is composed of a SiCN film, The SiCN film 202, SiCN film 208 or SiCN film 214, for example, the etching stopper film may be composed of a $SiO_2$ film, a SiC film, a SiN film, or a multi layer including any combination of layers selected from a SiCN film, a SiO$_2$ film, a SiC film, or a SiN film.

As for the wiring structure formed by the dual-damascene process, the structure may not include the SiCN film 208.

It is apparent that the present invention is not limited to the above embodiments, that may be modified and changed without departing from the scope and spirit of the invention.

The invention claimed is:

1. A method of manufacturing a semiconductor device, comprising:
   forming a plurality of insulating layers on a semiconductor substrate;
   forming a plurality of insulating interlayers, containing at least carbon, in contact with respective ones of said plurality of insulating layers; and
   forming a metal component in at least one of said plurality of insulating interlayers so as to contact with a corresponding one of said plurality of insulating layers;
   wherein said plurality of insulating interlayers are formed such that carbon content thereof is increased with respect to a corresponding increase in an abundance ratio of said metal component at an interface between respective ones of said plurality of insulating interlayers and corresponding ones of said plurality of insulating layers.

2. The method of manufacturing a semiconductor device according to claim 1, wherein in forming said plurality of insulating interlayers, the content of carbon included in a gas for forming said plurality of insulating interlayers is set larger when the abundance ratio of said metal component at the interface between said respective ones of said plurality of insulating interlayers and said corresponding ones of said plurality of insulating layers is larger such that carbon content of whichever one of said plurality of insulating interlayers has a larger abundance of said metal component formed therein becomes larger than carbon content of whichever one of said plurality of insulating interlayers has a smaller abundance of said metal component formed therein.

3. The method of manufacturing a semiconductor device according to claim 1, wherein said content of carbon included in a gas for forming said plurality of insulating interlayers is varied by varying a flow rate of a carbon-containing gas.

4. The method of manufacturing a semiconductor device according to claim 3, wherein in forming said plurality of insulating interlayers, the flow rate of said carbon-containing gas is set larger when the abundance ratio of said metal component at the interface between said respective ones of said plurality of insulating interlayers and said corresponding ones of said plurality of insulating layers is larger such that carbon content of whichever one of said plurality of insulating interlayers has a larger abundance of said metal component formed therein becomes larger than carbon content of whichever one of said plurality of insulating interlayers has a smaller abundance of said metal component formed therein.

5. The method of manufacturing a semiconductor device according to claim 3, wherein said forming the plurality of insulating interlayers includes:
   calculating the abundance ratio of said metal component at the interface between said respective ones of said plurality of insulating interlayers and said corresponding ones of said plurality of insulating layers in contact therewith after the fabrication based on a design drawing of the semiconductor device;
   calculating a desirable carbon content of said plurality of insulating interlayers based on said abundance rate calculated in said calculating the abundance ratio; and
   determining a flow rate of said carbon-containing gas so as to adjust the carbon content of said plurality of insulating interlayers to said desirable carbon content.

6. The method of manufacturing a semiconductor device according to claim 3, wherein said plurality of insulating interlayers are formed by a plasma CVD process using trimethylsilane gas as said carbon-containing gas.

* * * * *